(12) United States Patent
Goodrich et al.

(10) Patent No.: US 7,868,428 B2
(45) Date of Patent: Jan. 11, 2011

(54) PIN DIODE WITH IMPROVED POWER LIMITING

(75) Inventors: Joel Lee Goodrich, Westford, MA (US); James Joseph Brogle, Amesbury, MA (US)

(73) Assignee: M/A-COM Technology Solutions Holdings, Inc., Lowell, MA (US)

( * ) Notice: Subject to any disclaimer, the term of this patent is extended or adjusted under 35 U.S.C. 154(b) by 476 days.

(21) Appl. No.: 12/048,821

(22) Filed: Mar. 14, 2008

(65) Prior Publication Data
US 2009/0230516 A1 Sep. 17, 2009

(51) Int. Cl.
*H01L 31/113* (2006.01)
(52) U.S. Cl. ............... 257/656; 257/623; 257/E27.046
(58) Field of Classification Search ............ 257/656, 257/623, E27.046
See application file for complete search history.

(56) References Cited

U.S. PATENT DOCUMENTS

| 4,999,696 | A | * | 3/1991 | Gentner et al. ............ 257/458 |
| 5,268,310 | A | | 12/1993 | Goodrich et al. |
| 5,343,070 | A | * | 8/1994 | Goodrich et al. ........... 257/594 |
| 2006/0076589 | A1 | * | 4/2006 | Gao et al. ................ 257/292 |

* cited by examiner

*Primary Examiner*—Eugene Lee
(74) *Attorney, Agent, or Firm*—Christopher P. Maiorana, PC

(57) ABSTRACT

A PIN diode comprising an N-type substrate comprising a cathode of the PIN diode and having an intrinsic layer disposed upon the N-type substrate and having a top surface a P-type material disposed upon the top surface of the intrinsic layer comprising an anode of the PIN diode and a N-type material disposed over the sidewall of the cathode and over the sidewall and a portion of the top surface of the intrinsic material that is not occupied by the anode, wherein a horizontal gap is defined between the anode and the cathode through the intrinsic material, the gap being variable in width and/or the horizontal gap is less than the thickness of the intrinsic layer.

15 Claims, 6 Drawing Sheets

| Design | Shunt Radius (um) | Shunt Area (squm) | Bulk I-Layer (um) | Surface I-Layer (um) | "Spark-Plug" Gap (um) |
|---|---|---|---|---|---|
| A1 | 30 | 2904 | 5 | 10 | none |
| A2 | 43 | 5809 | 10 | 20 | none |
| A1S | 30 | 2904 | 5 | 10 | 3.3 |
| A2S | 43 | 5809 | 10 | 20 | 6.7 |
| B1 | 35 | 3848 | 5 | 10 | none |
| B2 | 49 | 7697 | 10 | 20 | none |
| B1S | 35 | 3848 | 5 | 10 | 3.3 |
| B2S | 49 | 7697 | 10 | 20 | 6.7 |

PIN DIODE WITH IMPROVED POWER LIMITING

FIELD OF THE INVENTION

The invention pertains to PIN diodes. More particularly, the invention pertains to the passive limiting of radio frequency energy using PIN diodes.

BACKGROUND OF THE INVENTION

Traditionally, PIN (p-type-intrinsic-n-type) diodes are fabricated by the growth, deposition, or other placement of layers vertically on a substrate.

A PIN diode usually comprises a N-type doped substrate on top of which is deposited an intrinsic material layer followed by a P-type doped layer.

The top, P-type region is the anode and the bottom, N-type region or substrate is the cathode. When unbiased, the PIN diode is in a high impedance state and can be represented as a capacitor the capacitance of which is given by $$C = A_{Anode} D_{si} E_o / T$$

where:

$A_{Anode}$ is the area of Anode;

$D_{si}$ is the dielectric constant of the intrinsic silicon;

$E_o$ is the permittivity of free space; and

T is the distance between the anode and cathode.

If a positive voltage is applied to the anode with respect to the cathode that is larger than a threshold value, a current will flow through the diode and the impedance will decrease. A PIN diode in a forward biased state can be represented as a resistor whose value decreases to a minimum value as the current through the PIN diode increases. The bias to change the PIN diode from the high impedance (off) state to the low impedance (on) state can be DC or AC. In the case of an AC voltage, the magnitude must be greater than the threshold value and the duration of the positive voltage must be longer than the transit time of carriers across the intrinsic region.

The higher the power of the RF energy and/or the lower the frequency of the energy, the more readily a PIN diode will turn on. Thus, certain combinations of voltage and RF frequency will cause the junction between the P-type region and the intrinsic region to fill with carriers and turn on the diode.

This property of PIN diodes has led to their use as passive limiters to protect other devices in microwave and other RF applications. For instance, in a radar that both transmits and receives, a low noise amplifier may be coupled to the antenna to amplify received signals. The receive circuitry may be configured to be extremely sensitive in order to pick up weak radar signals from great distances. Amplifiers and other circuitry have limited dynamic range. Thus, inherently, if a low noise amplifier and surrounding receive circuitry is particularly adapted to be extremely sensitive so that it can pick up very weak signals, it typically will not be able to handle large signals and thus may be damaged if exposed to a very powerful signal, such as may be coupled to the receiver input by reflection from the antenna during transmit periods or otherwise.

In such cases, it is desirable to place a limiting circuit between the antenna and the low noise amplifier to protect the amplifier from overload. For instance, it is known to place PIN diodes in shunt with a circuit in a microwave application in order to protect that circuit from being overloaded and damaged by signals exceeding the power handling capabilities of that circuit. Particularly, if the input signal is relatively small, the PIN diode essentially behaves as a small capacitor and has little impact on the operation of the circuit it is protecting. However, if the RF signal becomes relatively large, then the PIN diode starts to conduct and, therefore, behaves essentially as a resistor that shunts most of the signal to ground.

Given their properties as described above, PIN diodes are well-suited to be used for such power limiting or protecting functions in RF applications.

As an illustrative example, the circuit of FIG. 1A may be placed in between the antenna and the low noise amplifier in a radar system. A simple, passive receiver-protection limiter comprises a PIN (positive-intrinsic-negative) diode 102 and an RF choke inductor 103, both of which are in shunt with the main signal path between the input 104 (e.g., coupled to the antenna) and the output 105 (e.g., coupled to the receiver). In most limiter circuits, the input and output of the circuit include dc blocking capacitors 106, 107. A single-stage limiter can typically reduce the amplitude of a large input signal by 20 to 30 dB.

With reference to FIGS. 2A and 2B, which are a cross-sectional, elevation view and a top, plan view, respectively, a typical PIN diode 1 has a mesa-like cross sectional shape, as illustrated in FIG. 2A, and comprises a N-type substrate 4 forming the cathode of the diode, an intrinsic region 5, and a P-type anode region 6. An insulating layer 8 covers the entire mesa-like structure except for the top of the anode and the bottom of the cathode, each of which will need to be covered with a metal contact pad for purposes of electrical contact with other circuitry on or off chip. For sake of clarity, the Figures illustrate only the semiconductor aspects of the diode and omit the contact pads, and/or other metallizations. The cross sectional area of the diode in FIG. 2A decreases from the N layer 4 to the P layer 6. This produces a shape resembling a top-truncated frustrum of a cone (i.e., the mesa-like shape). The whole structure may be encapsulated in glass 9 or another suitable encapsulation material.

A detailed discussion of the use of PIN diodes as power limiters and the structures and properties of such diodes that dictate their performance in such applications can be found in Cory, R., "PIN-limiter diodes effectively protect receivers", EDN, Dec. 17, 2004, which is incorporated herein by reference.

However, in short, there are essentially two aspects of the design of a PIN diode that most significantly dictate the power level and/or frequency at which the diode will turn on in such situations. They are the thickness, y, of the intrinsic layer 5 between the P layer 6 and the N layer 4, and (2) the area of the junction 7 between the P type anode and the intrinsic region. More particularly, the thinner the intrinsic region, y, the higher the capacitance and the smaller the duration of the positive going cycle above the threshold value necessary to turn on the diode. Thus, essentially, as the intrinsic region 5 decreases in thickness, the capacitance increases. However, the total capacitance should be kept within a certain range for purposes of impedance matching with the other circuitry in connection with which it is used. Also, the thinner the intrinsic region 5, the larger the capacitance per unit area. Thus, for a given thickness of the intrinsic region 5, designers can keep the capacitance within a useful range by decreasing the area of the P/I junction 7. However, the downside of decreasing the area of the P/I junction is that the thermal impedance of the device will increase, thereby decreasing the amount of power that the diode can handle without failure, i.e. the amount of energy that it can dissipate.

Accordingly, there are many trade-offs between all of the dimensions of the various regions of a PIN diode that a designer can use to obtain the performance desired for a particular application of a PIN diode. More specifically, in the case of designing PIN diodes for use as RF power limiters, the designer must balance the minimum power level that will turn the diode on so as to start dissipating power, on the one hand, and the maximum power level that it can handle and dissipate before failure. In many cases, the necessary compromise cannot be accomplished within a single PIN diode.

Therefore, it often is necessary to use two PIN diodes, ¼ wavelength apart from each other, as illustrated in FIG. 1B, which shows a limiter circuit similar to that of FIG. 1A, including DC blocking capacitors 116 and 117, an RF choke inductor 113, but employing two PIN diodes 112a and 112b between the input 114 and output 115 spaced ¼ wavelength apart from each other along the signal path. Diode 112b has a thinner intrinsic region so that it will turn on at a relatively lower power. Diode 112a has a thicker intrinsic region so that it can handle more power. Thus, when the power exceeds a first threshold, diode 112b will turn on and start dissipating and reflecting power back towards the input. Then, as the power level continues to increase, diode 112a turns on and dissipates and reflects most of the power, thereby protecting, not only the circuit that is being protected, but also diode 112b.

U.S. Pat. No. 5,343,070 discloses a PIN diode and a method for fabricating the same.

SUMMARY OF THE INVENTION

A PIN diode comprising an N-type substrate comprising a cathode of the PIN diode and having an intrinsic layer disposed upon the N-type substrate and having a top surface a P-type material disposed upon the top surface of the intrinsic layer comprising an anode of the PIN diode and a N-type material disposed over the sidewall of the cathode and over the sidewall and a portion of the top surface of the intrinsic material that is not occupied by the anode, wherein a horizontal gap is defined between the anode and the cathode through the intrinsic material, the gap being variable in width and/or the horizontal gap is less than the thickness of the intrinsic layer.

DETAILED DESCRIPTION OF THE INVENTION

Figure 3A:
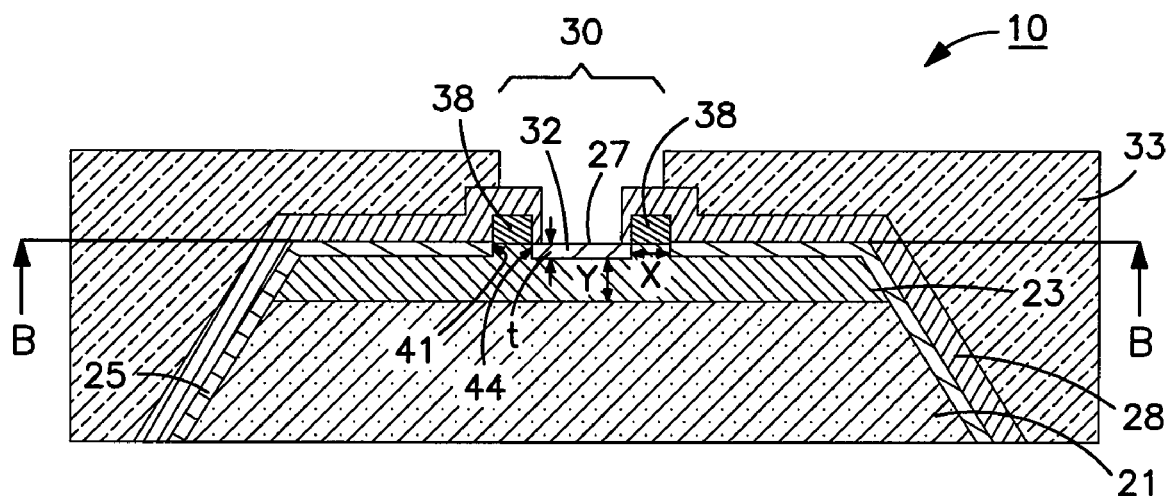
FIG. 3A is a cross-sectional, elevation view of a PIN diode in accordance with the principles of the present invention.
Figure 3B:
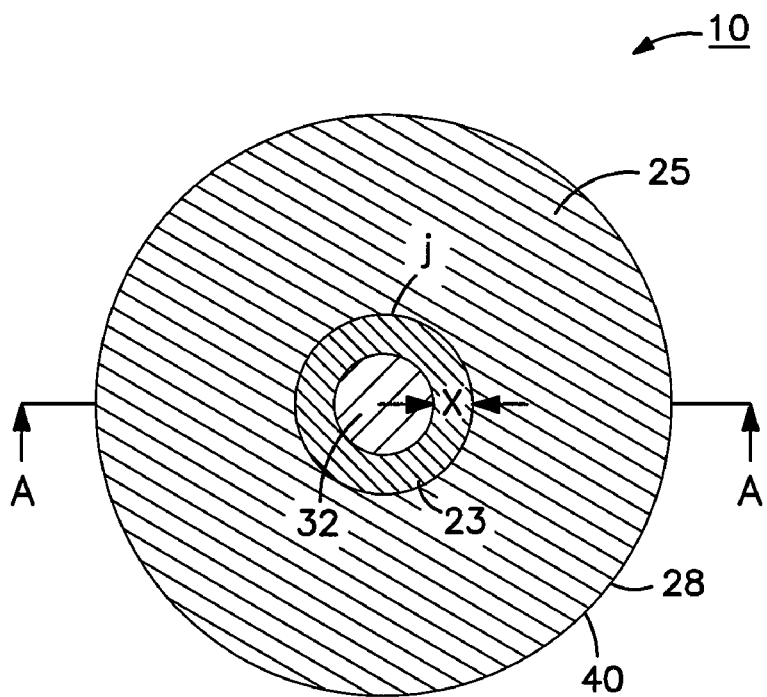
FIG. 3B is a top, plan view of the PIN diode of FIG. 3A.

FIG. 3A is a cross-sectional, elevation view of a PIN diode 10 in accordance with the principles of the present invention. FIG. 3B is a top, plan view of the same diode. The structure illustrated in FIGS. 3A and 3B essentially is two PIN diodes in one. It incorporates the properties of both a PIN diode having a thinner intrinsic region dimension (so as to turn on responsively to RF signals of relatively lower power) and a PIN diode having a thicker intrinsic region (so as to dissipate more power without failing). More particularly, the inventive PIN diode adds a new dimension that a designer can use in the fabrication of a PIN diode.

In the prior art, the spacing or gap between the planar junction between the n-type cathode region and the intrinsic region, on the one hand, and the parallel planar junction between the p-type anode region and the intrinsic region, on the other hand, that defined the capacitance of the diode was defined by the thickness, y, of the intrinsic region. It was a one-dimensional factor.

In the present invention, on the other hand, the gap can be defined in two directions, namely, (1) the vertical (or y) dimension as in the prior art, and (2) in the horizontal (or x) dimension. This provides full three dimensional flexibility in designing the intrinsic gap. Whether one considers this to be the ability to fabricate multiple PIN diodes in the same physical space or a single PIN diode having variable intrinsic gap, it provides the ability to fabricate a PIN diode system having much broader dynamic range than in the prior art.

With reference to FIG. 3A, in one particular fabrication embodiment, the process starts with an N-type doped silicon substrate 21. Preferably, this conductivity results from the predetermined doping of the substrate with selected ions, as is well-known in the art. By way of illustrative example, the doping of the substrate 21 may be form by melting silicon and mixing the molten silicon with arsenic to a concentration of, typically about $2(10^{19})$ arsenic atoms per cubic centimeter and then solidifying the melt. Of course, many other methods are well-known and may be used to dope the substrate. An undoped or intrinsic layer of silicon 23 is disposed upon this n+ substrate.

An insulator material structure 38 is deposited on top of the substrate. The insulator layer is preferably silicon dioxide.

Next, an anode region 32 is formed on top of the intrinsic layer 23 by using photolithography and subsequent etch of the insulator 38. This exposes the area 27 of layer 23 to the implantation of boron which creates the anode region 32. Another temporary insulator (not shown) is deposited to protect the anode region during subsequent processing. Preferably, the anode is formed by a low energy, high dosage application and implantation of boron. For example, boron ions may be applied at an energy of about 32 KeV in a concentration of about $4(10^{15})$ atoms per square centimeter to produce a junction having a charge carrier concentration of greater than about $10^{19}$ atoms per cubic centimeter. This example is merely illustrative and many alternatives are possible without departing from the invention.

The N+ substrate 21 and the intrinsic layer 23 can then be etched using known photolithography techniques to shape it into the Mesa-shaped structure. Note that the use of terms such a horizontal and vertical herein are not intended to be used in a limiting manner and refer to the exemplary orientation shown in the Figures, which is the typical orientation during fabrication. Obviously, the wafers on which the PIN diodes are formed may be placed in any orientation.

Also note that the drawings do not show the complete structure of a PIN diode, but just the main layers in order not to obfuscate the invention. For instance, the metal contacts and/or other metallizations that would typically be necessary for connecting the diode to other circuitry is not shown.

Next, an N+ diffusion region 25 is formed over the mesa structure (the mesa structure comprising the N+ cathode layer 21 and the intrinsic layer 23). This N+ diffusion region 25 covers the sidewall of the mesa as well the top surface of the intrinsic region 23 up to but not including the anode area 32 and the insulators 38. The N+ diffusion layer essentially brings the n doped cathode region 21 to the top surface of the structure. The N+ diffusion region 25 may be formed, for instance, by doping with phosphorous to a concentration of about $10^{20}$ atoms per cubic centimeter. However, it should be understood that other n-type dopants and other concentrations thereof may be used without departing from the invention. The charge carrier concentration in the N+ diffusion region 25 generally may vary between about $10^{18}$ atoms per centimeter to about $10^{21}$ atoms per cubic centimeter. The conductivity of the layer 25 can be increased by the addition of a suitable metal silicide such as cobalt disilicide or titanium silicide. In such an embodiment, layer 25 would be a combination of an N+ diffusion and a metal silicide.

Next, encapsulation layers 28 and 33 are deposited on the entire surface of the structure. Layer 28 may be a silicon nitride layer and layer 33 may be glass. Next, layer 33 is planarized. Then a window 30 is etched through the glass layer 33 The window 30 is made larger than the size of the anode 32. The window can be etched using conventional photolithography techniques.

Next, the layer 28 is opened by standard photolithography and etching steps to expose the anode 32 leaving insulator 38 encapsulated.

Although not shown, the circuit may be completed at this point by connecting it to surrounding circuitry by commonly known methods and using commonly known fabrication techniques.

Figure 1A:
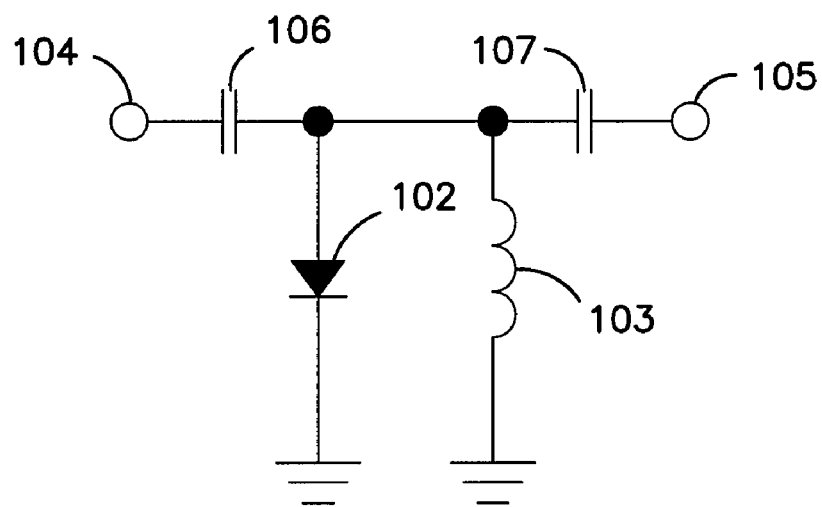
FIG. 1A is a circuit diagram of a circuit employing a PIN diode as a limiter.
Figure 1B:
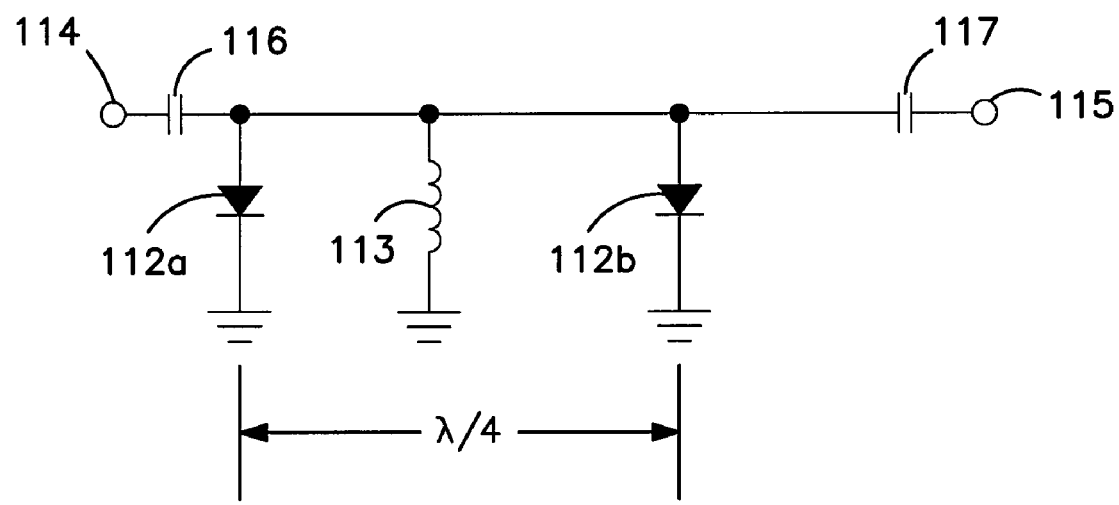
FIG. 1B is a circuit diagram of a second circuit employing two PIN diodes having different intrinsic region thicknesses as a limiter.
Figure 2A:
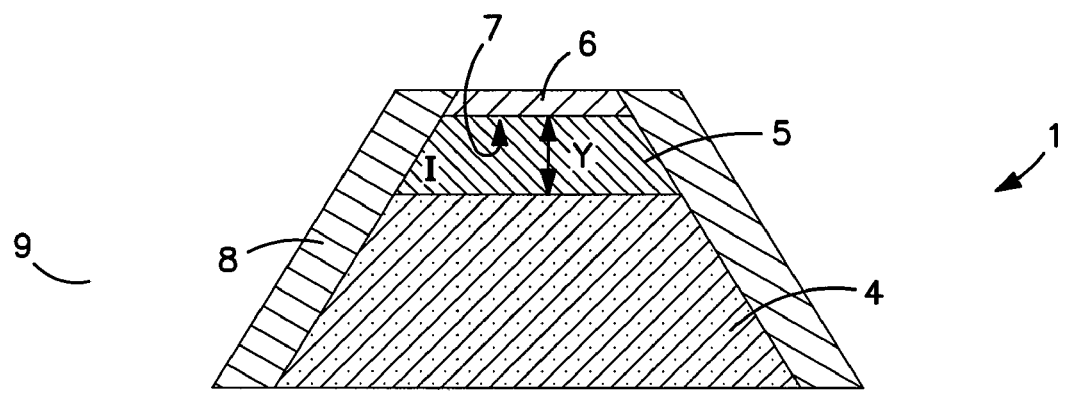
FIG. 2A is a cross-sectional, elevation view of a conventional PIN diode.
Figure 2B:
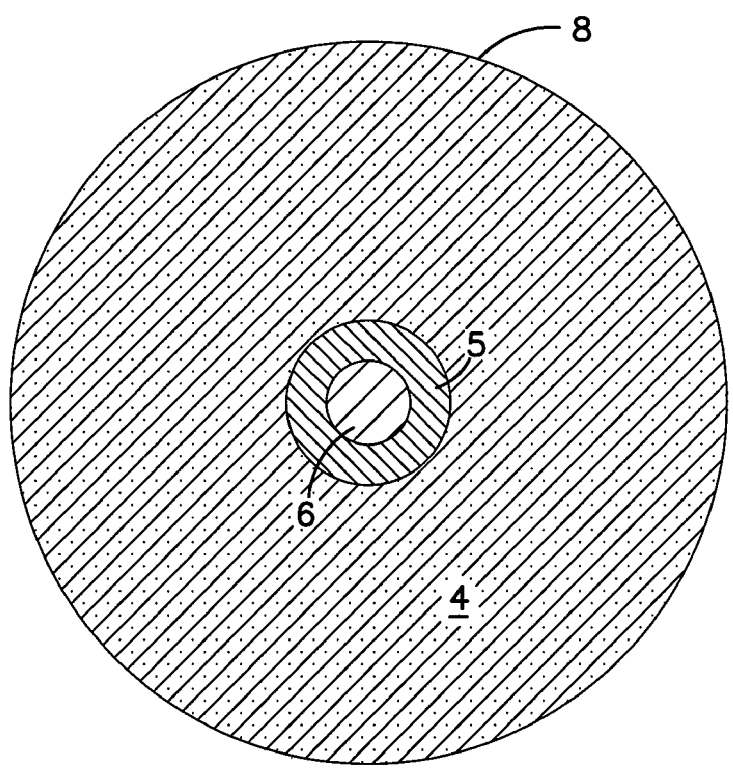
FIG. 2B is a top, plan view of the PIN diode of FIG. 2A.

In the diode of FIGS. 3A and 3B, the gap distance between the anode region and the cathode region through the intrinsic region can be distinctly measured in two places. First, the conventional epitaxial depth of the intrinsic region, shown by Y in FIG. 2A, defines a first, vertical gap distance between the anode and cathode. However, in addition, the horizontal distance, X, shown in FIGS. 3A and 3B between the side wall 41 of the anode and the side wall 44 of the N+ diffusion region defines a second gap between the anode and the cathode. Particularly, the region 25 is in contact with the underlying N+ type cathode region 21 and, therefore, essentially is part of the cathode.

Whether one considers this configuration to comprise multiple diodes in the same area or a single diode having multiple intrinsic gaps, the result is a PIN diode configuration that can turn on in response to low RF power by virtue of having a small horizontal intrinsic gap, yet still handle high RF signals without failing because it also has a larger vertical intrinsic gap which allows the use of a larger anode area.

For instance, the photolithography can be designed to make the X dimension small and the epitaxy can be controlled so that the thickness of the intrinsic layer, i.e., the vertical intrinsic gap, Y, is larger than X so that the diode will turn on by conducting across the horizontal gap in response to a relatively low power RF signal and, as the RF power increases, the diode starts conducting across the larger vertical Y gap, which can handle much more power.

In addition, note that the area of the horizontal gap is very small. Particularly, it is the area of the side walls 41 and 44 of the anode region and the N+ diffusion region, respectively. For instance, assuming for sake of illustration and as shown in FIG. 3B that the anode is circular in cross section, the area of the side wall of the anode is $\pi dt$, where t is the thickness of the anode and d is the diameter of the anode. Likewise, the area of the side wall 44 of the N+ diffusion region is $\pi jt$, where j is the inner diameter of the N+ diffusion region and t is the thickness of the N+ diffusion region. Preferably, the anode and the N+ diffusion regions are the same thickness, t, but this is not necessary.

Since the area of the horizontal gap is so small (assuming the anode and N+ diffusion regions are not unusually thick), there is a high capacitance per unit area across this gap X, but a relatively small total capacitance. On the other hand, the capacitance per unit area across the vertical gap is much lower because it has much greater thickness Y. Thus, this PIN diode configuration provides the benefits of both the thermal impedance of a large intrinsic region/large anode diode that can handle a lot of power and the lower turn on power of a small intrinsic region/small anode area diode.

Figure 4A:
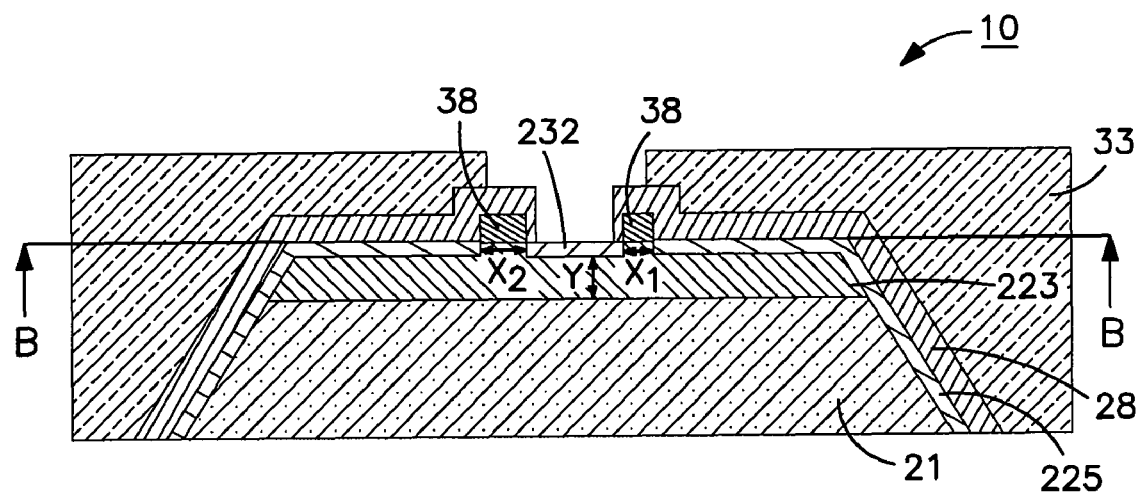
FIG. 4A is a cross-sectional, elevation view of a PIN diode in accordance with a second embodiment of the present invention.
Figure 4B:
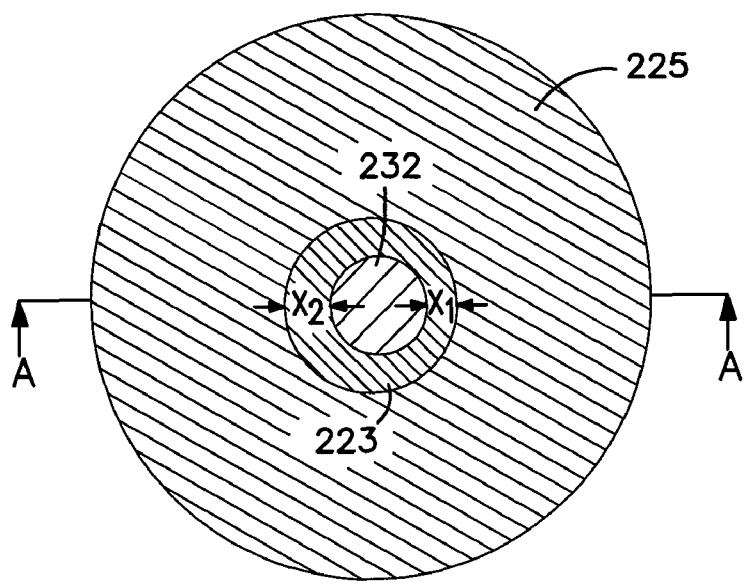
FIG. 4B is a top, plan view of the PIN diode of FIG. 4A.

In the exemplary embodiment shown in FIGS. 3A and 3B, the anode region, intrinsic region, and N+ diffusion region are circular and concentric. Accordingly, the horizontal gap is uniform for the entire diode. However, this is not necessary. As shown in FIGS. 4A and 4B, for instance, which illustrates a second embodiment of the invention, one or more of the anode region 232, intrinsic region 223, and the N+ diffusion-metal silicide region 225 can be made non-concentric with each other (by use of a suitable photolithography mask) so that the horizontal gap is variable. In the embodiment illustrated in FIGS. 4A and 4B, the anode is made non-concentric with the intrinsic region 223 and N+ diffusion-metal silicide region 225. This provides even greater flexibility in terms of combining the features of low turn-on power and high power handling. Particularly, with reference to FIG. 4B, the horizontal gap is smallest at X1 and continuously increases as one moves around the circular anode to a maximum shown at X2, 180° from X1. Accordingly, this diode will turn on slowly and uniformly across the horizontal gap as the RF power increases. More particularly, the diode will start conducting across the gap at X1 at a certain power. As the RF power increases, the diode will start conducting across a greater portion of the horizontal gap until it is conducting across all of the horizontal gap. Then, assuming that the vertical gap, y, is greater than the horizontal gap, it will eventually start conducting across the vertical gap.

Of course, there is nothing to prevent a designer from designing the diode so that the vertical gap distance, y, is between X1 and X2, if a particular application dictated that such a design would be effective. In such a case, of course, the diode would start to conduct across the vertical gap before it starts conducting across the entire horizontal gap.

Accordingly, generally, it would make more sense to make a diode with a smaller horizontal gap and a larger vertical gap for a PIN diode that is to be used as a power limiter.

The present invention is particularly advantageous in that it requires no additional steps or cost over conventional diode fabrication processes, such as the one disclosed in the aforementioned U.S. Pat. No. 5,343,070. Rather, it requires only the use of different photolithography mask or masks for changing the horizontal configuration of one or more (depending on the particular design) the anode, intrinsic region, and/or N+ diffusion region. However, it provides significant advantages over the prior art, such as embodied in the aforementioned article. Particularly, in the prior art, it was essentially necessary to fabricate the low-power PIN diode and high power PIN diode on two different wafers because the intrinsic regions of those two diodes needed to have different thicknesses. This factor, in and of itself adds expense, but also creates other complicated design issues in terms of placing the two diodes in series spaced ¼ of a wavelength apart from each other.

Figure 5A:
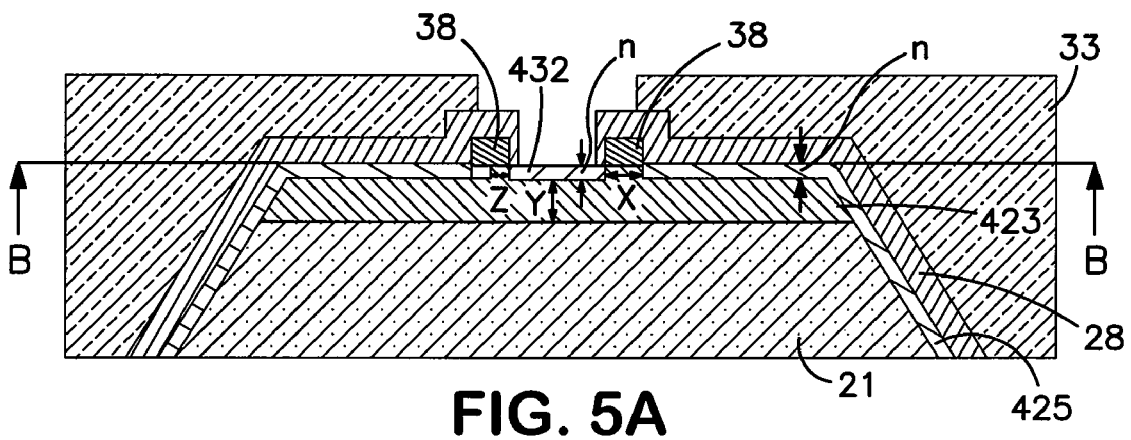
FIG. 5A is a cross-sectional, elevation view of a PIN diode in accordance with a third embodiment of the present invention.
Figure 5B:
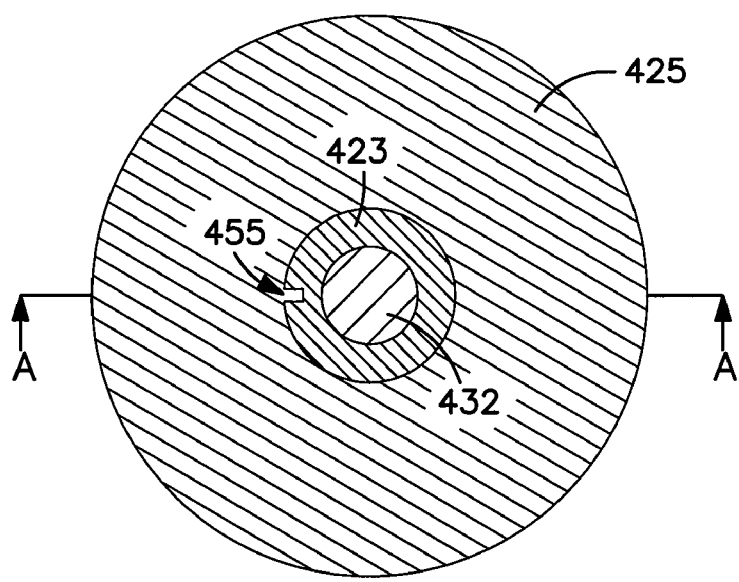
FIG. 5B is a top, plan view of the PIN diode of FIG. 5A.
Figure 5C:
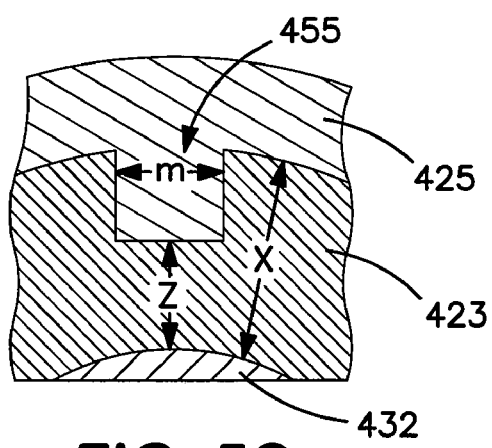
FIG. 5C is a close up top plan view of the spark plug portion of the PIN diode of FIG. 5A.

FIGS. 5A, 5B, and 5C illustrate a third embodiment of the invention, this embodiment including what is herein termed a "spark plug". Particularly, in the embodiments shown in FIGS. 3A, 3B, 4A, and 4B, the anode, intrinsic region, and N+ diffusion region are all circular. However, this is not a requirement. For instance, as illustrated in FIG. 5B, the intrinsic region is designed with one or more notches 455 (i.e., the "spark plugs") so that the depth of the horizontal intrinsic gap, z, between the anode region and cathode region is smaller across the notched portion than across the rest of the intrinsic region.

As can be seen in FIG. 5B, the horizontal gaps between the anode region 432 and the N+ diffusion-metal silicide region 425 in the area of the notch 455 are smaller than elsewhere. Accordingly, carriers will fill in the gaps near the spark plugs 455 (and the diode will start conducting in the spark plug gaps) earlier than it will across the rest of the horizontal dimension of the intrinsic region 423. The spark plug region is so named because it provides the initial carriers to turn on the diode and provide carriers for the remainder of the diode to turn on the rest of way. The area of the spark plug is defined as the length of the gap region times the depth of the N+ diffusion-metal silicide region 425, i.e., dimension m in FIG. 5C multiplied by dimension n in FIG. 5A, also can be used to provide desirable performance properties. Particularly, the small spark plug gap has a large capacitance per unit area. Thus, if that area is kept relatively small, it may assist in maintaining the total capacitance of the diode within a manageable range as may be necessary for impedance matching and other circuit considerations.

Figures 6A, 6B:
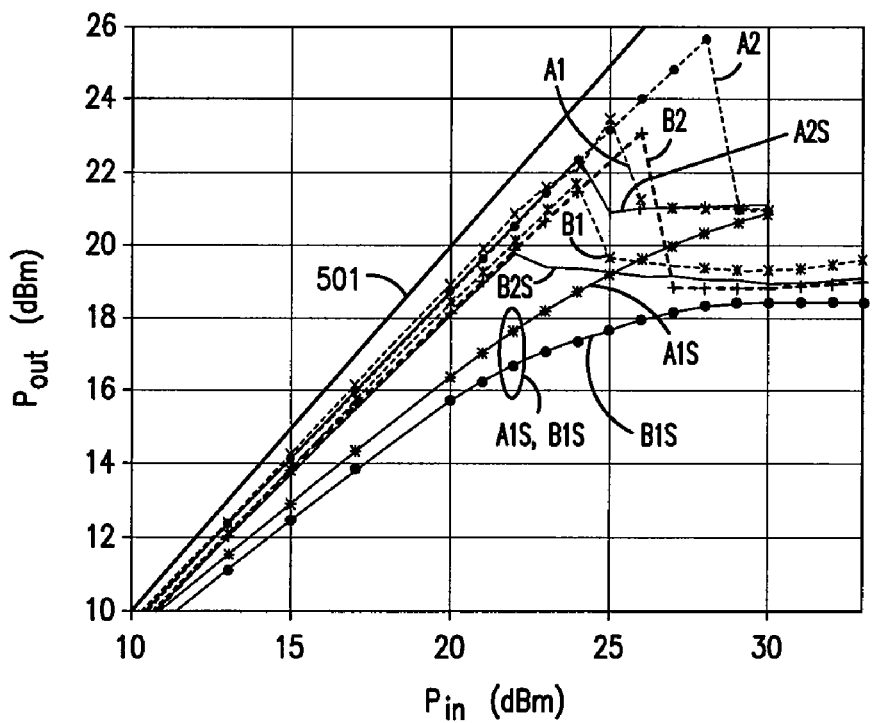
FIG. 6A is a graph illustrating the power dissipation of various PIN diodes constructed in accordance with the prior art and in accordance with the principles of the present invention.
FIG. 6B is a table showing the dimensions of the various PIN diodes whose performance is shown in FIG. 6A.

FIG. 6A is a graph showing power output as a function of power input for PIN diodes of various designs in accordance with the prior art and in accordance with the present principles of the invention. FIG. 6B is a table showing the dimensions of the various different PIN diode designs whose performance is shown in FIG. 6A. With reference first to FIG. 6B, the first column is simply a name designator of the particular diode. The second column is the shunt radius, r, in microns, i.e., the radius of the circular anodes. The third column is the shunt area in plan view, i.e., $\Pi r^2$. The fourth column is the vertical thickness of the intrinsic region, e.g., dimension y in FIG. 3A. The fifth column is the horizontal gap distance (excluding the spark plug gap), e.g., dimension x in FIGS. 3A and 3B. Finally, the last column is the distance between the anode region and the N+ diffusion region across the spark plug. The diodes were RF tested at 3.2 GHz up to a input power of about 33 dBm at 25° C.

Thus, as can be seen, designs A1S, A2S, B1S, and B2S, are essentially identical to designs A1, A2, B1, and B2, respectively, except that A1S, A2S, B1S, and B2S have spark plugs, whereas A1, A2, B1, and B2, do not. Also, as can be seen from the table of FIG. 6B, all of the designs have a basic layout where X is twice Y. Turning now to FIG. 5A, and particularly, for instance, comparing the lines for A1S and B1S to the lines for A1 and B1, it can be seen that the existence of the spark plug causes the diode to start limiting the transmitted power much earlier (under less input power) than in the absence of a spark plug gap. The advantage exists all the way up to about 30 dDm of input power at which point performance becomes more or less equivalent again.

As expected, the A1S and B1S diodes, which have the smallest spark plug gaps, began limiting the output power at the lowest input power and have the smoothest transition from insertion loss state to limiting state. All of the diodes without spark plugs overshoot their final flat leakage by as much as 5 dB.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A PIN diode comprising:
   an N-type substrate comprising a cathode of the PIN diode and having a sidewall;
   an intrinsic material disposed upon the N-type substrate and having a top surface and a sidewall;
   a P-type material disposed upon the top surface of the intrinsic layer comprising an anode of the PIN diode; and
   a N-type material disposed over the sidewall of the cathode and over the sidewall and a portion of the top surface of the intrinsic material that is not occupied by the anode;
   wherein a horizontal gap is defined between the anode and the cathode through the intrinsic material, the gap being variable in width.

2. The PIN diode of claim 1 wherein the anode is an island of P-type material surrounded by the N-type material on the top surface of the intrinsic material.

3. The PIN diode of claim 2 wherein the anode is circular in horizontal cross section and the N-type material has an inner circumference on the top surface of the intrinsic material that is circular in cross section, and wherein the circular anode and circular inner circumference of the N-type material are non-concentric.

4. The PIN diode of claim 3 further comprising an insulating layer disposed over the N-type substrate, the intrinsic material and the N-type material and defining a window therein through which the anode is exposed.

5. The PIN diode of claim 4 wherein the N-type material comprises an N+ diffusion layer with metal silicide.

6. The PIN diode of claim 5 wherein the top surface of the intrinsic material is at least twice the area of the anode.

7. The PIN diode of claim 2 wherein the top surface of the intrinsic material has at least one notch such that the horizontal gap between the N-type material and the anode is smaller in the at least one notch than elsewhere, whereby conduction between the cathode and the anode will begin across the area of the notch before conduction occurs across the rest of the gap.

8. A power limiter circuit comprising the PIN diode of claim 1.

9. A circuit comprising the PIN diode of claim 1 in series with a radio frequency circuit, the PIN diode serving as a protection circuit for the radio frequency circuit by dissipating radio frequency energy when the PIN diode turns on in response to radio frequency energy above a threshold.

10. A PIN diode comprising:
an N-type substrate having a sidewall;
an intrinsic material disposed upon the N-type substrate and having a top surface and a sidewall;
a P-type material disposed upon the top surface of the intrinsic layer; and
a N-type material disposed over the sidewall of the N-type substrate and over the sidewall and a portion of the top surface of the intrinsic material that is not occupied by the P-type material;
wherein a horizontal gap is defined between the P-type material and the N-type substrate through the intrinsic material, the horizontal gap being less than a vertical gap between the P-type material and the N-type substrate defined by the thickness of the intrinsic material and wherein the horizontal gap is less than the vertical gap.

11. The PIN diode of claim 10 wherein the N-type material defines a window on the top surface of the intrinsic material and the P-type material is disposed within the window.

12. The PIN diode of claim 10 wherein the horizontal gap is variable in width and wherein the vertical gap is greater than the horizontal gap at its smallest.

13. The PIN diode of claim 10 wherein the horizontal gap is variable in width and wherein the vertical gap is greater than the horizontal gap at its largest.

14. The PIN diode of claim 11 further comprising an insulation layer disposed upon the intrinsic material in a portion of the window not occupied by the P-type material.

15. The PIN diode of claim 13 further comprising an encapsulation layer disposed over the N-type substrate, the intrinsic material, the N-type material, and an insulating layer and defining a window therein through which the P-type material is exposed.

* * * * *